United States Patent
Goishi et al.

(10) Patent No.: US 8,059,547 B2
(45) Date of Patent: Nov. 15, 2011

(54) TEST APPARATUS AND TEST METHOD

(75) Inventors: Masaru Goishi, Saitama (JP); Hiroyasu Nakayama, Saitama (JP); Masaru Tsuto, Saitama (JP)

(73) Assignee: Advantest Corporation, Tokyo (JP)

( * ) Notice: Subject to any disclaimer, the term of this patent is extended or adjusted under 35 U.S.C. 154(b) by 336 days.

(21) Appl. No.: 12/329,635

(22) Filed: Dec. 8, 2008

(65) Prior Publication Data

US 2010/0142383 A1 Jun. 10, 2010

(51) Int. Cl.
| | |
|---|---|
| G01R 31/08 | (2006.01) |
| G06F 11/00 | (2006.01) |
| G08C 15/00 | (2006.01) |
| H04J 1/16 | (2006.01) |
| H04J 1/14 | (2006.01) |
| H04L 1/00 | (2006.01) |
| H04L 12/26 | (2006.01) |

(52) U.S. Cl. ........ 370/241; 370/246; 370/248; 370/249; 370/250; 370/252

(58) Field of Classification Search .......... 370/241, 370/246, 248, 249, 250, 252
See application file for complete search history.

(56) References Cited

U.S. PATENT DOCUMENTS

2009/0059804 A1* 3/2009 Fujikami et al. ............. 370/250
2010/0110906 A1* 5/2010 Ram ............................ 370/252

FOREIGN PATENT DOCUMENTS

| JP | 04-260151 | 9/1992 |
|---|---|---|
| JP | 2001-134469 | 5/2001 |
| JP | 2002-050196 | 2/2002 |
| JP | 2002-152317 | 5/2002 |
| JP | 2004-120675 | 4/2004 |
| JP | 2004253864 | 9/2004 |
| JP | 2006-352290 | 12/2006 |
| JP | 2008072191 | 3/2008 |

OTHER PUBLICATIONS

"Office Action of Japan Counterpart Application", issued on Jan. 11, 2011, p. 1.
"Search Report of PCT counterpart application", issued on Mar. 16, 2010, p. 1-p. 5.
"Office Action of Japan Counterpart Application" issued on Mar. 23, 2010, p. 1.
Andrew C. Evans, The New ATE: Protocol Aware, International Test Conference, IEEE, pp. 1-10, 2007.
"Search Report of PCT counterpart application", issued on Oct. 6, 2009, p. 1-p. 5.
"Form PCT/IB/338, PCT/IB/373, PCT/ISA/237 of PCT counterpart application", issued on Jul. 14, 2011, p. 1-p. 6.

* cited by examiner

Primary Examiner — Hassan Phillips
Assistant Examiner — Lonnie Sweet
(74) Attorney, Agent, or Firm — Jianq Chyun IP Office

(57) ABSTRACT

Provided is a test apparatus that tests a device under test, comprising an upper sequencer that sequentially designates packets transmitted to and from the device under test, by executing a test program for testing the device under test; a packet data sequence storing section that stores a data sequence included in each of a plurality of types of packets; and a lower sequencer that reads, from the packet data sequence storing section, a data sequence of a packet designated by the upper sequencer and generates a test data sequence used for testing the device under test.

10 Claims, 11 Drawing Sheets

PACKET SEQUENCE

| //seq  | packet  | parameter | address |
|--------|---------|-----------|---------|
| IDXI 2 | WRITE_A |           | xxxxxxx |
| NOP    | WRITE_B | n=16      | xxxxxxx |
| IDXI 2 | READ_A  |           | xxxxxxx |
| NOP    | READ_B  | n=32      | xxxxxxx |
| EXIT   | IDLE    |           | xxxxxxx |

FIG. 9

IDLE SEQUENCE

| //seq  | ctrl | data |
|--------|------|------|
| IDXI 7 |      | 0x00 // idle code (7 words) |
| RTN    |      | 0x00 // idle code |

FIG. 10

WRITE PACKET

| //seq  | ctrl          | data |
|--------|---------------|------|
| NOP    |               | 0x0F // start code |
| NOP    | REGI=0        | 0x01 // command |
| IDXI 2 | REGI=REGI^DB1 | DB1 // address (2 words) |
| IDXI 4 | REGI=REGI^DB2 | DB2 // data    (4 words) |
| NOP    |               | REGI//check code |
| RTN    |               | 0xFF//end   code |

TEST APPARATUS AND TEST METHOD

BACKGROUND

1. Technical Field

The present invention relates to a test apparatus and a test method.

2. Related Art

A device for transmitting packets is known. A test apparatus that tests a device for transmitting packets is also known.

Each packet involved in the packet transmission between devices includes, in addition to the actual data, redundant data such as a start code, an end code, and a check code. Therefore, when testing the device for transmitting packets, the test apparatus must generate a complicated test pattern that includes such redundant data.

The device transmitting the packets performs a handshake with its communication partner. The device transmitting packets may exchange transmission requests and denials, transmission initiation and completion responses, transmission successes and failures, and the like, with the communication partner.

Furthermore, when testing the device transmitting the packets, the test apparatus must perform a handshake with the device under test. While waiting for a response from the device under test during the handshake, the test apparatus must also send idle packets and prepare the next transmission in order to respond quickly. Accordingly, when testing such a device, the test apparatus must generate a complicated test pattern.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising an upper sequencer that sequentially designates packets transmitted to and from the device under test, by executing a test program for testing the device under test; a packet data sequence storing section that stores a data sequence included in each of a plurality of types of packets; and a lower sequencer that reads, from the packet data sequence storing section, a data sequence of a packet designated by the upper sequencer and generates a test data sequence used for testing the device under test.

According to a second aspect related to the innovations herein, one exemplary test method may include a method for testing a device under test with a test apparatus, comprising providing the test apparatus with an upper sequencer and a lower sequencer; causing the upper sequencer to sequentially designate packets transmitted to and from the device under test, by executing a test program for testing the device under test; and causing the lower sequencer to read, from a packet data sequence storing section storing a data sequence included in each of a plurality of types of packets, a data sequence of a packet designated by the upper sequencer and generate a test data sequence used for testing the device under test.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 9 shows an exemplary test program indicating a packet sequence.

FIG. 10 shows examples of a command sequence for generating an idle packet and a data sequence included in an idle packet.

FIG. 11 shows examples of a command sequence for generating an idle packet and a data sequence included in a write packet.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
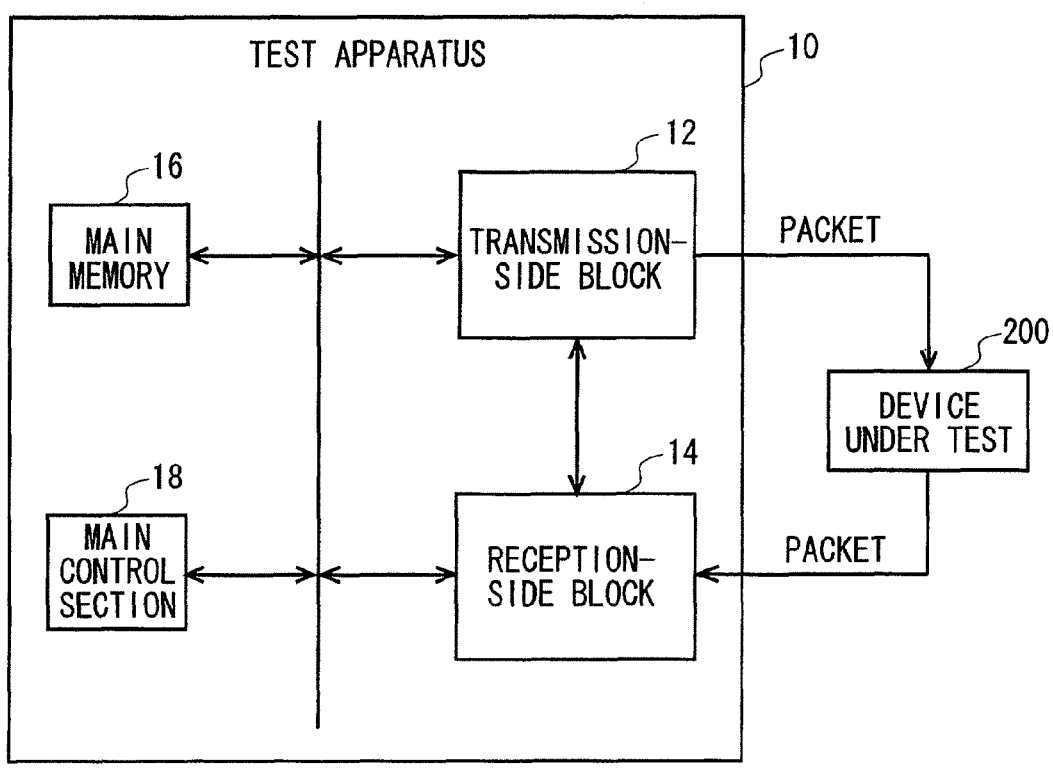
FIG. 1 shows an exemplary configuration of a test apparatus 10 according to an embodiment of the present invention, along with a device under test 200.

FIG. 1 shows an exemplary configuration of a test apparatus 10 according to an embodiment of the present invention, along with a device under test 200. The test apparatus 10 tests the device under test 200 that sends and receives packets.

The test apparatus 10 is provided with a transmission-side block 12, a reception-side block 14, a main memory 16, and a main control section 18. The transmission-side block 12 sends packets to the device under test 200 in an order designated by a test program. The reception-side block 14 receives the packets from the device under test 200 and judges the acceptability of the communication between the test apparatus 10 and the device under test 200.

The main memory 16 stores the test program for testing the device under test 200. More specifically, the main memory 16 stores a test program indicating a packet sequence that designates the order in which the packets are sent to the device under test 200 and received by the device under test 200. The main memory 16 also stores individual data that is included in each packet being sent or received and that is designated independently for each packet.

The main control section 18 transmits the individual data and the test program stored in the main memory 16 to the transmission-side block 12 and the reception-side block 14. The main control section 18 performs overall control of the test apparatus 10, including initiating the test, ending the test, and the like.

Figure 2:
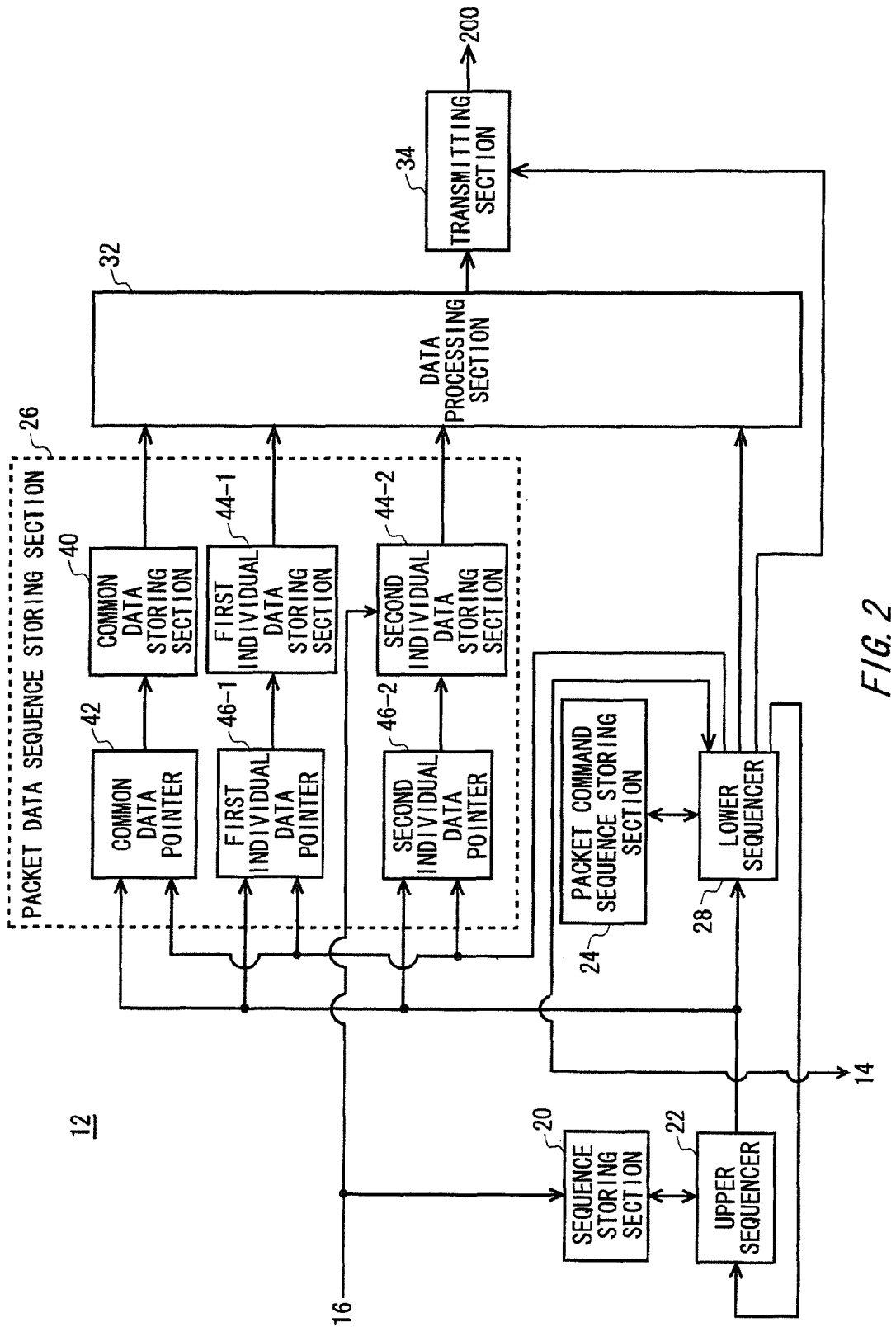
FIG. 2 shows a configuration of the transmission-side block 12.

FIG. 2 shows a configuration of the transmission-side block 12. The transmission-side block 12 includes a sequence storing section 20, an upper sequencer 22, a packet command sequence storing section 24, a packet data sequence storing section 26, a lower sequencer 28, a data processing section 32, and a transmitting section 34.

The sequence storing section 20 stores the test program indicating the packet sequence. The sequence storing section 20 receives the test program from the main memory 16 prior to testing or during testing.

The upper sequencer 22 executes the test program stored in the sequence storing section 20 to designate the order of the packets sent and received to and from the device under test 200. For example, the upper sequencer 22 designates an address, e.g. a beginning address, in the packet command sequence storing section 24 of a command sequence for generating the packets to be transmitted to and from the device under test 200. The upper sequencer 22 may further designate an address, e.g. a beginning address, in the packet data sequence storing section 26 of a data sequence that includes the packets to be transmitted to and from the device under test 200.

In this way, the upper sequencer 22 individually designates an address of a command sequence for generating a packet and an address of a data sequence that includes the same packet. In this case, when a data sequence or a command sequence shared by two or more packets in the test program is designated, the upper sequencer 22 may designate the address of the same data sequence or the same command sequence in the two or more packets.

The packet command sequence storing section 24 stores command sequences for generating each of a plurality of types of packets, in association with each type of packet. For example, the packet command sequence storing section 24 stores a command sequence for generating a write packet, a command sequence for generating a read packet, a command sequence for generating an idle packet, and the like.

The packet data sequence storing section 26 stores data sequences included in each of the plurality of types of packets in association with each type of packet. For example, the packet data sequence storing section 26 stores a data sequence included in a write packet, a data sequence included in a read packet, a data sequence included in an idle packet, and the like.

The packet data sequence storing section 26 may include a common data storing section 40, a common data pointer 42, a first individual data storing section 44-1, a second individual data storing section 44-2, a first individual data pointer 46-1, and a second individual data pointer 46-2. The common data storing section 40 stores common data shared by each type of packet, respectively, and included in the data sequences in each type of packet. For example, the common data storing section 40 stores, for each type of packet, a start code indicating the start of the packet, an end code indicating the end of the packet, a command code identifying the type of the packet, and the like.

The common data pointer 42 acquires, from the upper sequencer 22, the beginning address of the block storing the common data included in the packet designated by the upper sequencer 22. The common data pointer 42 further acquires an offset position in the block from the lower sequencer 28. The common data pointer 42 then supplies the common data storing section 40 with the address determined by the beginning address and the offset position, e.g. the address obtained by adding the offset position to the beginning address, and supplies the data processing section 32 with the common data stored in this address.

The first and second individual data storing sections 44-1 and 44-2 store the individual data that is different for each packet and included in the data sequence in each type of packet. For example, the first and second individual data storing sections 44-1 and 44-2 store the actual data received from the device under test 200 or the actual data sent to the device under test 200, which is included in each packet.

The first individual data storing section 44-1 stores predetermined individual data that is unrelated to the executed test program. The second individual data storing section 44-2 stores individual data that changes depending on the executed test program. For example, the second individual data storing section 44-2 receives the individual data sent from the main memory 16 prior to testing or during testing.

The first and second individual data pointers 46-1 and 46-2 receive, from the upper sequencer 22, the beginning address of the block storing the individual data included in the packet designated by the upper sequencer 22. The first and second individual data pointers 46-1 and 46-2 further acquire an offset position in the block from the lower sequencer 28. The first and second individual data pointers 46-1 and 46-2 supply the first and second individual data storing sections 44-1 and 44-2 with the address determined by the beginning address and the offset position, e.g. the address obtained by adding the offset position to the beginning address, and supplies the data processing section 32 with the individual data stored in this address.

The lower sequencer 28 reads the command sequence of the packet designated by the upper sequencer 22, i.e. the command sequence at the address designated by the upper sequencer 22, from the packet command sequence storing section 24, and sequentially executes each command included in the read command sequence. The lower sequencer 28 sequentially reads the data sequence of the packet designated by the upper sequencer 22, i.e. the data sequence at the address designated by the upper sequencer 22, from the packet data sequence storing section 26 according to the executed command sequence, and generates a test data sequence for testing the device under test 200.

The lower sequencer 28 may supply the common data pointer 42, the individual data pointer 46-1, and the individual data pointer 46-2 with the offset position indicating the position of the data corresponding to the executed command in the block storing the data sequence included in the packet designated by the upper sequencer 22. In this case, the lower sequencer 28 may generate an initial value for the first command and generate the offset position as a count value that increases incrementally each time the executed command changes. The command sequence executed by the lower sequencer 28 desirably does not include a jump forward command, a branch command, or the like. In this way, the lower sequencer 28 can perform fast processing with a simple configuration.

The lower sequencer 28 supplies the data processing section 32 with control data that instructs application of a designated process, e.g. an operation or data conversion, to the individual data and the common data read during each command execution. In this way, the lower sequencer 28 can set a designated portion of the data in the packet designated by the upper sequencer 22 to be the data resulting from the designated process being applied to the read data.

The lower sequencer 28 instructs the data processing section 32 concerning which of the common data, the individual data, and the data processed by the data processing section 32 to output for each command execution. Here, the individual data may be the predetermined individual data that is unrelated to the executed test program or the individual data that changes depending on the executed test program. In other words, for each command execution, the lower sequencer 28 instructs the data processing section 32 concerning which of the common data storing section 40, the first individual data storing section 44-1, the second individual data storing section 44-2, or a register storing the data processed by the data processing section 32 to read and output data from.

In this way, the lower sequencer 28 can generate a data portion to be changed depending on the packet in a packet designated by the upper sequencer 22, based on the individual data read from the individual data storing section 44. The lower sequencer 28 can generate a data portion common to each type of packet in a packet designated by the upper sequencer 22, based on the common data read from the common data storing section 40. The lower sequencer 28 can generate a designated data portion, which is data obtained by applying the designated process to the read data, in a packet designated by the upper sequencer 22.

The lower sequencer 28 may supply the upper sequencer 22 with an end notification indicating that the execution of the command sequence of the packet designated by the upper sequencer 22 is completed. In this way, the upper sequencer 22 can sequentially designate packets according to the progression of the command sequence execution by the lower sequencer 28.

The lower sequencer 28 designates, in the transmitting section 34, edge timings of signals sent to the device under test 200. For example, the lower sequencer 28 supplies the transmitting section 34 with a timing signal that controls the edge timing for each packet.

The lower sequencer 28 communicates with a reception-side lower sequencer 28 in the reception-side block 14 described below in relation to FIG. 5. In this way, the transmission-side lower sequencer 28 in the transmission-side block 12 can perform a handshake with the reception-side lower sequencer 28 in the reception-side block 14 to execute the command sequences in synchronization with the reception-side lower sequencer 28.

For example, the transmission-side lower sequencer 28 notifies the reception-side lower sequencer 28 that the test data sequence of a predetermined packet has been sent to the device under test 200. In this way, the transmission-side lower sequencer 28 can prohibit the judging section 84 from judging the acceptability of the data sequence received by the receiving section 82 while the reception-side lower sequencer 28 is waiting to receive notification from the transmission-side lower sequencer 28.

The transmission-side lower sequencer 28 may receive notification from the reception-side lower sequencer 28 that a data sequence matching the generated test data sequence has been received, and then generate the test data sequence of a predetermined packet. In this way, the transmission-side lower sequencer 28 can send the predetermined packet to the device under test 200 after receiving a prescribed packet from the device under test 200.

The data processing section 32 receives data from the common data storing section 40, the first individual data storing section 44-1, and the second individual data storing section 44-2, applies a process designated by the lower sequencer 28 to the data, and outputs the resulting data as the test data sequence. Depending on the content of the designation by the lower sequencer 28, the data processing section 32 may output the unaltered received data as the test data sequence. An exemplary configuration of the data processing section 32 is described in relation to FIG. 3.

The transmitting section 34 sends the test data sequence output by the data processing section 32 to the device under test 200. An exemplary configuration of the transmitting section 34 is described in relation to FIG. 4.

Figure 3:
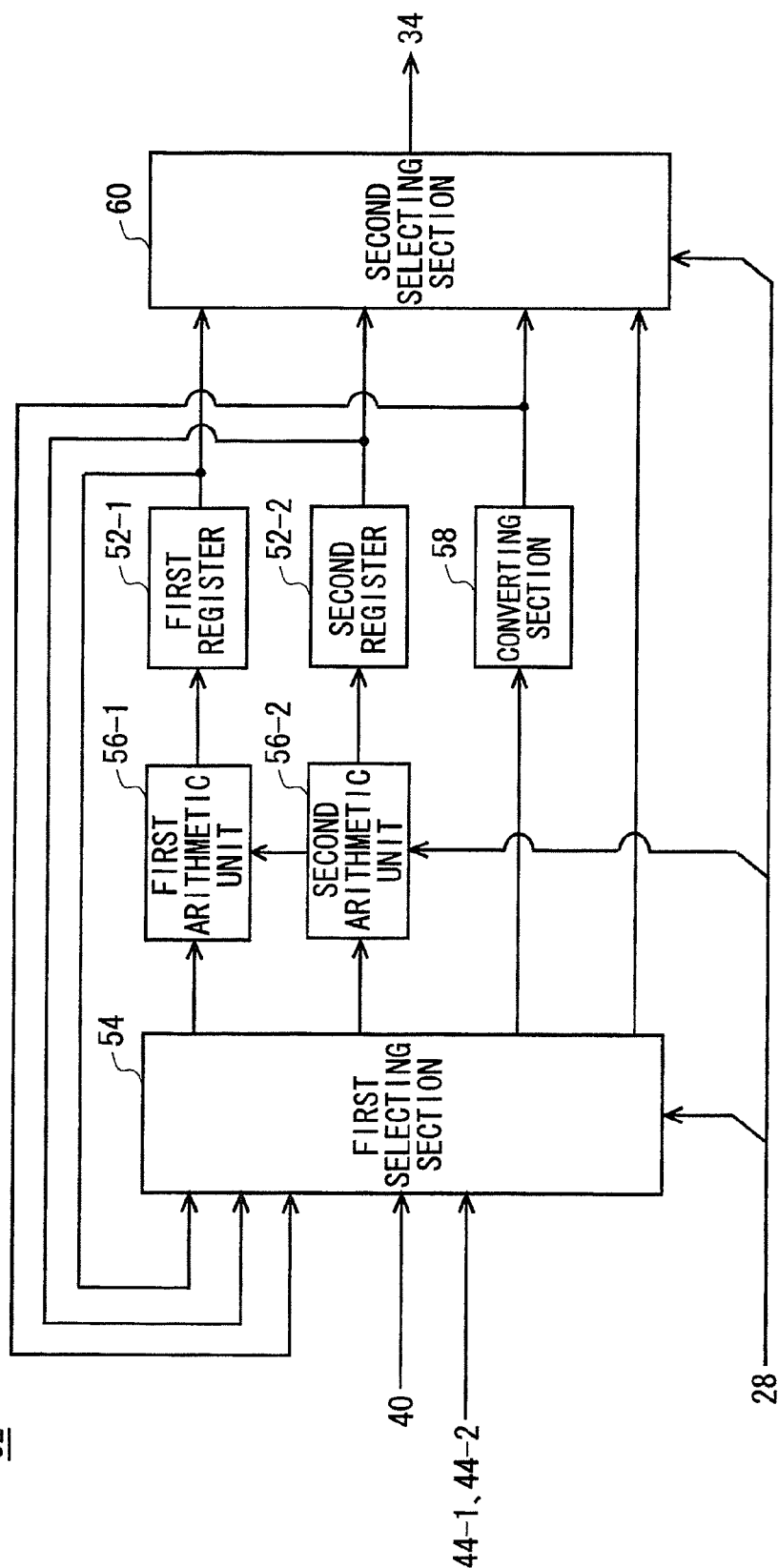
FIG. 3 shows an exemplary configuration of the data processing section 32 in the transmission-side block 12.

FIG. 3 shows an exemplary configuration of the data processing section 32 in the transmission-side block 12. The data processing section 32 in the transmission-side block 12 may include one or more registers 52, a first selecting section 54, one or more arithmetic units 56, a converting section 58, and a second selecting section 60.

Each of the one or more registers 52 stores an operational process result from a previous cycle. In the present embodiment, the data processing section 32 includes a first register 52-1 and a second register 52-2.

The first selecting section 54 selects, for each cycle, the data designated by the lower sequencer 28 from among the common data from the common data storing section 40, the individual data from each of the individual data storing sections 44, i.e. the first individual data storing section 44-1 and the second individual data storing section 44-2, the data from each register 52, i.e. the first register 52-1 and the second register 52-2, and the data output from the converting section 58. Then, for each cycle, the first selecting section 54 supplies the selected data to the arithmetic units 56, i.e. the first register 52-1 and the second register 52-2, the converting section 58, or the second selecting section 60 designated by the lower sequencer 28.

The one or more arithmetic units 56 are disposed to correspond respectively to the one or more registers 52. In the present embodiment, the data processing section 32 includes a first arithmetic unit 56-1 corresponding to the first register 52-1 and a second arithmetic unit 56-2 corresponding to the second register 52-2. Each arithmetic unit 56 may perform such operations as a logical operation, a four arithmetic operation, a pseudo-random number generation, or an error-correcting code generation. For each cycle, each arithmetic unit 56 performs the operation designated by the lower sequencer 28 on the data selected by the first selecting section 54 and stores the result in the corresponding register 52.

The converting section 58 converts the data selected by the first selecting section 54 using a preset table, for each cycle. For example, the converting section 58 performs an 8b-10b data conversion. The converting section 58 outputs the converted data.

The second selecting section 60 selects, for each cycle, the data corresponding to the designated packet from among the data from selected by the first selecting section 54, i.e. the data from the first individual data storing section 44-1 the second individual data storing section 44-2, or the common data storing section 40, the data in the one or more registers 52, and the data output by the converting section 58. The second selecting section 60 outputs the selected data as the test data sequence.

Figure 4:
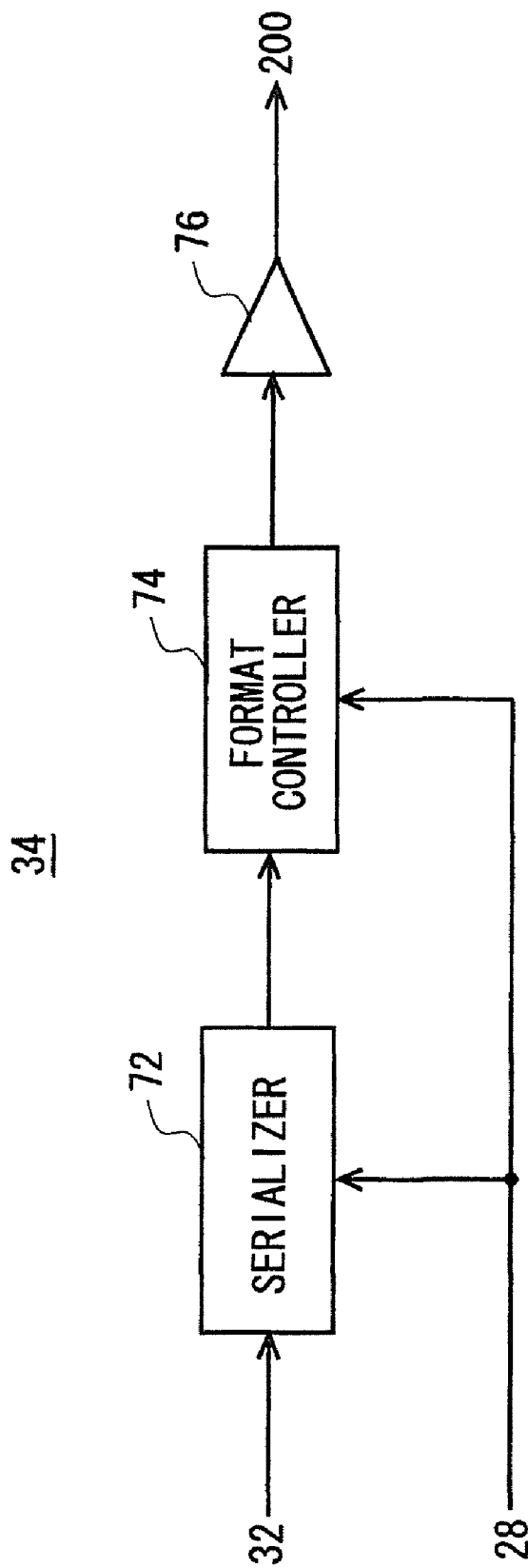
FIG. 4 shows an exemplary configuration of the transmitting section 34 in the transmission-side block 12.

FIG. 4 shows an exemplary configuration of the transmitting section 34 in the transmission-side block 12. The transmitting section 34 may include a serializer 72, a format controller 74, and a driver 76.

The serializer 72 converts the test data sequence received from the data processing section 32 into a serial waveform pattern. The format controller 74 generates a signal with a waveform corresponding to the waveform pattern received from the serializer 72. Furthermore, the signal output by the format controller 74 has a waveform whose logic value changes at the edge timings designated by the lower sequencer 28. The driver 76 supplies the device under test 200 with the signal output by the format controller 74.

Figure 5:
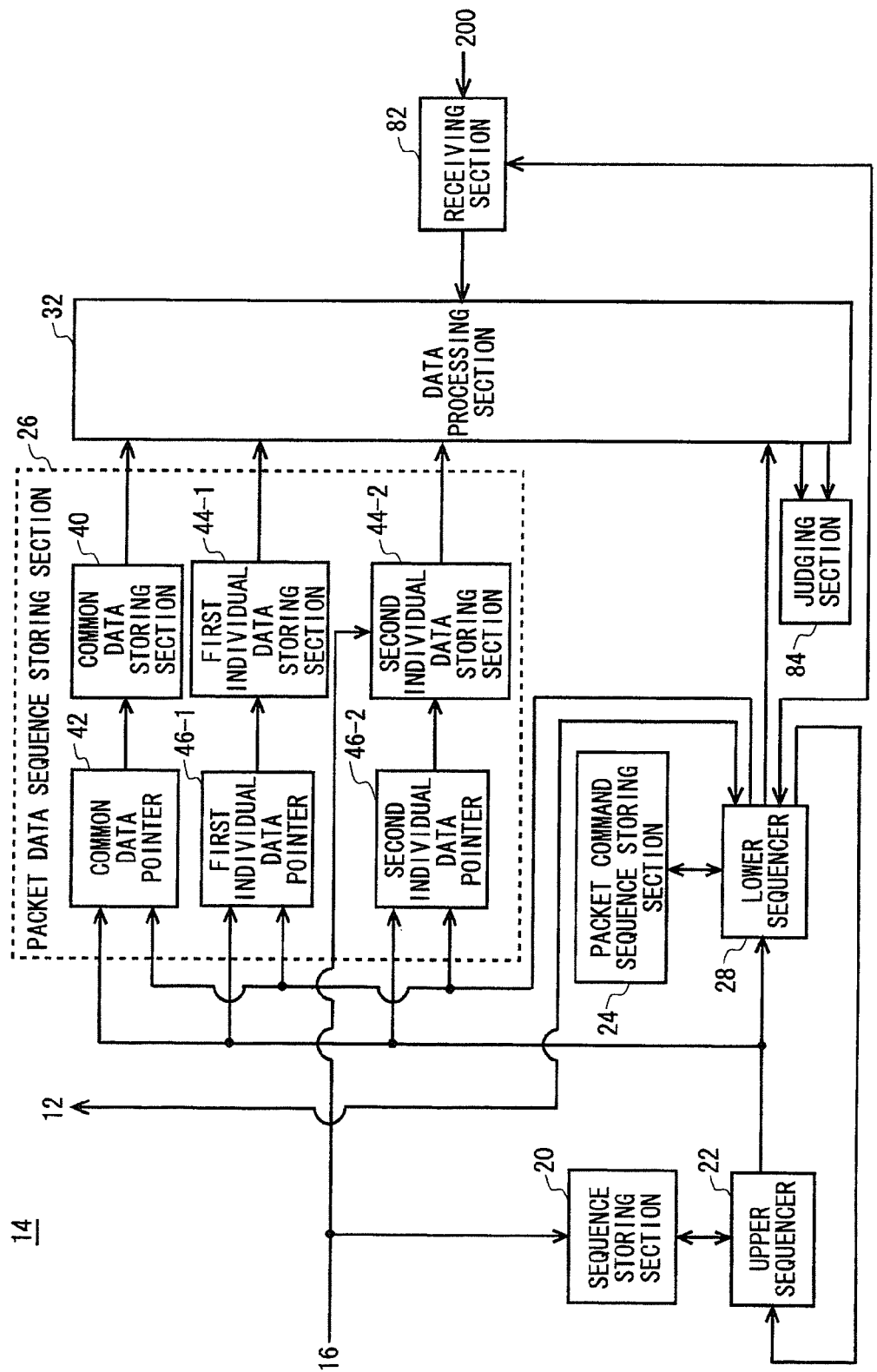
FIG. 5 shows a configuration of the reception-side block 14.

FIG. 5 shows a configuration of the reception-side block 14. The reception-side block 14 has substantially the same function and configuration as the transmission-side block 12 shown in FIG. 2. Therefore, components of the reception-side block 14 that have the substantially same function and configuration as components of the transmission-side block 12 are given the same numerals and the following description includes only differing points.

The reception-side block 14 includes the sequence storing section 20, the upper sequencer 22, the packet command sequence storing section 24, the packet data sequence storing section 26, the lower sequencer 28, the data processing section 32, the receiving section 82, and the judging section 84. The receiving section 82 receives the data sequence of a packet from the device under test 200. An exemplary configuration of the receiving section 82 is described in relation to FIG. 7.

The data processing section 32 in the reception-side block 14 receives the data sequence received by the receiving section 82, and outputs the received data sequence together with the generated test data sequence. An exemplary configuration of the data processing section 32 is described in relation to FIG. 6.

The lower sequencer 28 in the reception-side block 14 outputs a data sequence that is expected to be output by the device under test 200, as the test data sequence. The lower sequencer 28 in the reception-side block 14 sets, in the receiving section 82, a strobe timing for reading the data values of the signal output by the device under test 200.

The judging section 84 receives, from the data processing section 32, the test data sequence and the data sequence received by the receiving section 82. The judging section 84 judges the acceptability of the communication with the device under test 200 based on a result obtained by comparing the data sequence received by the receiving section 82 to the test data sequence. For example, the judging section 84 includes a logic comparing section that determines whether the data sequence received by the receiving section 82 and the test data sequence are the same, and a fail memory that stores the comparison result.

The lower sequencer 28 in the reception-side block 14 communicates with the transmission-side lower sequencer 28 in the transmission-side block 12 shown in FIG. 2. In this way, the reception-side lower sequencer 28 in the reception-side block 14 performs a handshake with the transmission-side lower sequencer 28 in the transmission-side block 12 to execute the command sequence in synchronization with the transmission-side lower sequencer 28.

For example, the reception-side lower sequencer 28 notifies the transmission-side lower sequencer 28 that a data sequence matching the test data sequence generated by the reception-side lower sequencer 28 has been received. In this way, the transmission-side lower sequencer 28 can receive notification from the reception-side lower sequencer 28 that a data sequence matching the generated test data sequence has been received, and can then generate the test data sequence of the predetermined packet.

The transmission-side lower sequencer 28 may prohibit the judging section 84 from judging the acceptability of the data sequence received by the receiving section 82 until notification is received from the transmission-side lower sequencer 28 that the test data sequence of the predetermined packet has been sent to the device under test 200. In this way, after sending a prescribed packet to the device under test 200, the reception-side lower sequencer 28 can judge whether a response to the prescribed packet has been output from the device under test 200.

Figure 6:
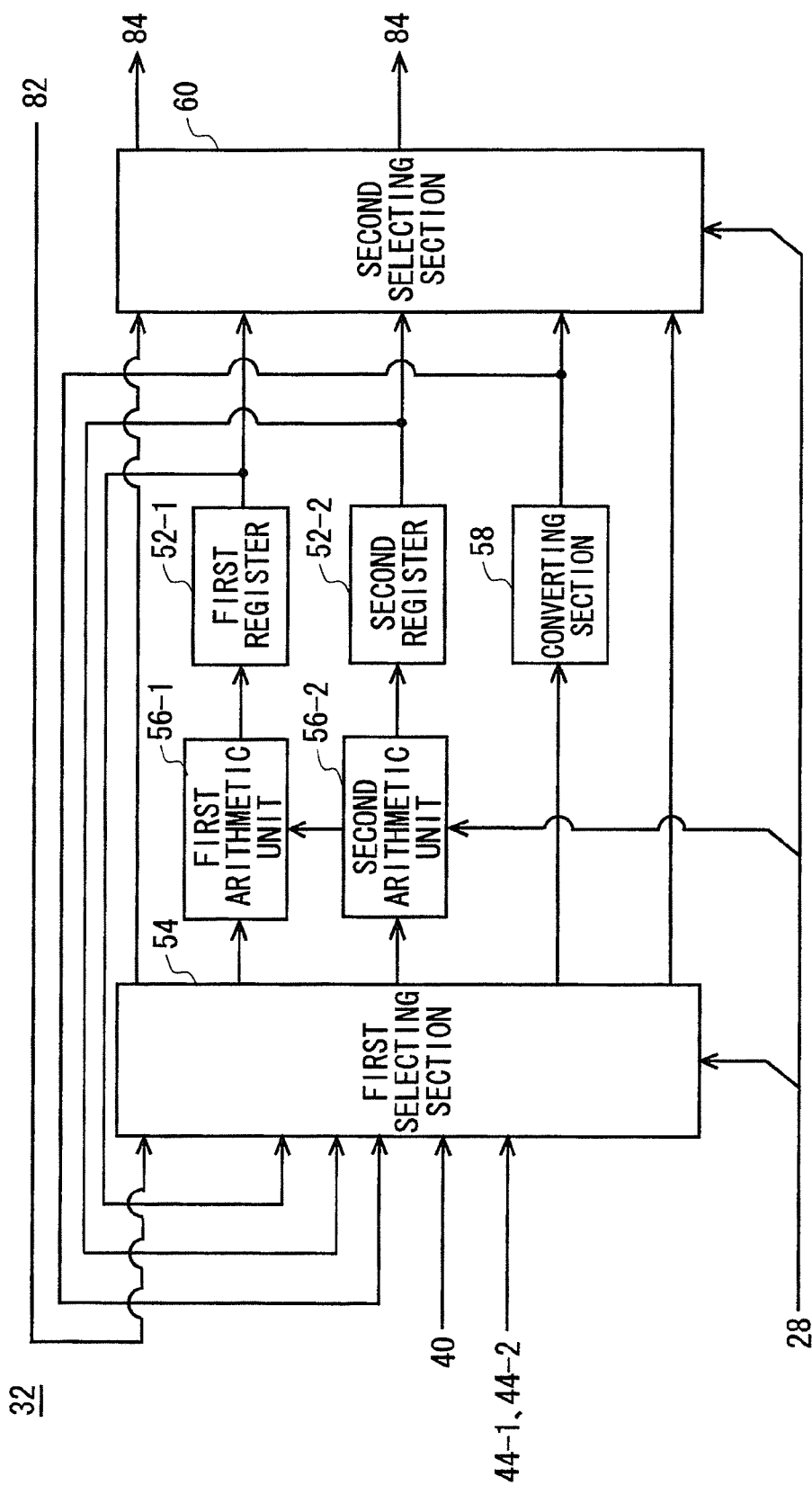
FIG. 6 shows an exemplary configuration of the data processing section 32 in the reception-side block 14.

FIG. 6 shows an exemplary configuration of the data processing section 32 in the reception-side block 14. The data processing section 32 in the reception-side block 14 has substantially the same function and configuration as the data processing section 32 in the transmission-side block 12 shown in FIG. 3. Therefore, components of the data processing section 32 in the reception-side block 14 that have the substantially same function and configuration as components of the data processing section 32 in the transmission-side block 12 are given the same numerals and the following description includes only differing points.

For each cycle, the first selecting section 54 in the reception-side block 14 further supplies the second selecting section 60 with the data received by the receiving section 82. For each cycle, the second selecting section 60 in the reception-side block 14 further outputs the data received by the receiving section 82 and supplied from the first selecting section 54, along with the data of the test data sequence. In this way, the data processing section 32 in the reception-side block 14 can receive the data sequence received by the receiving section 82 and output the received data sequence along with the generated test data sequence.

Figure 7:
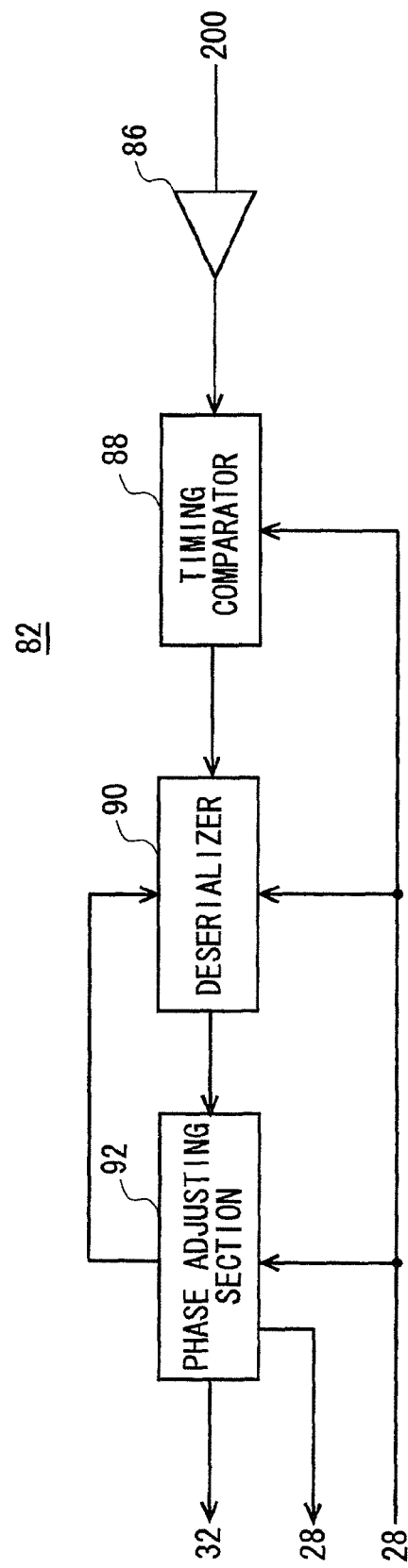
FIG. 7 shows an exemplary configuration of the receiving section 82 in the reception-side block 14.

FIG. 7 shows an exemplary configuration of the receiving section 82 in the reception-side block 14. The receiving section 82 may include a level comparator 86, a timing comparator 88, a deserializer 90, and a phase adjusting section 92.

The level comparator 86 compares the signal output by the device under test 200 to a threshold value and outputs the result as a logic signal. The timing comparator 88 sequentially acquires the data of the logic signal output by the level comparator 86, at timings designated by the lower sequencer 28. The deserializer 90 converts the data sequence acquired by the timing comparator 88 into a parallel test data sequence. The phase adjusting section 92 detects a specification code at the beginning of the packet and adjusts the phase at which the deserializer 90 divides the parallel test data.

Figure 8:
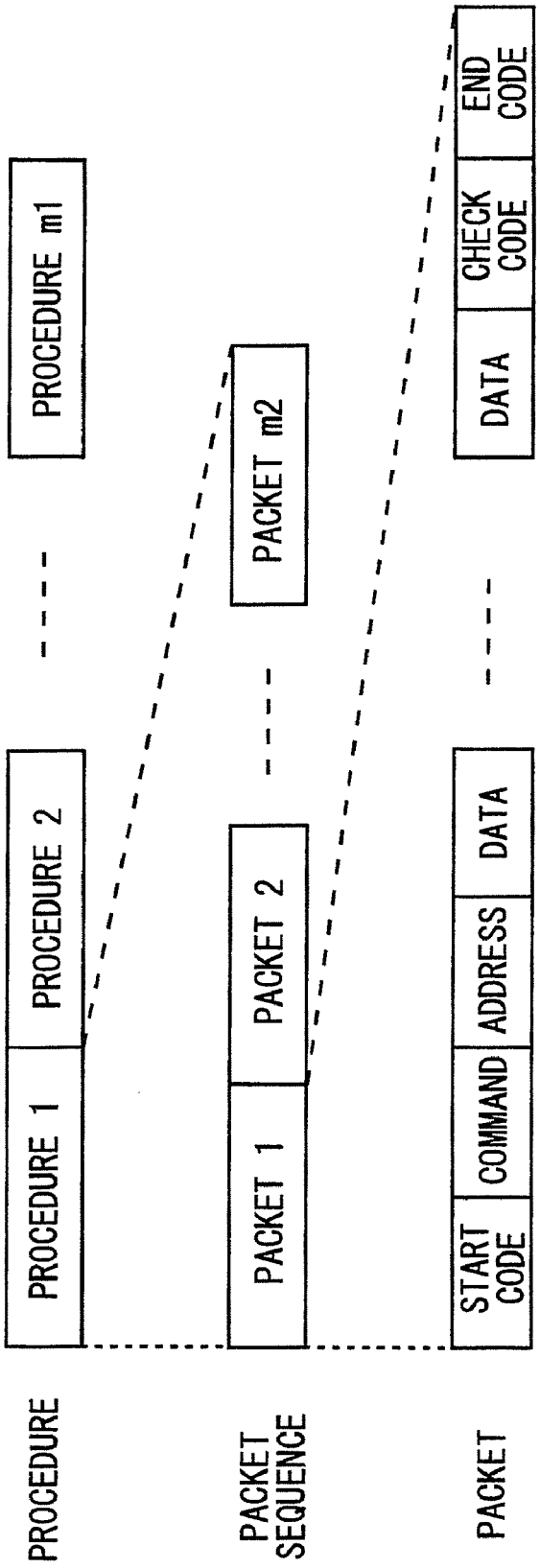
FIG. 8 shows an exemplary data configuration of procedures, a packet sequence, and packets.

FIG. 8 shows an exemplary data configuration of procedures, a packet sequence, and packets. The test apparatus 10 executes a test program that includes one or more procedures in series. Each procedure defines the sequence of the packets sent to the device under test 200 and the sequence of the packets expected to be received from the device under test 200.

The upper sequencer 22 performs such a test program to sequentially designate the packets sent to the device under test 200 and the packets received from the device under test 200. The lower sequencer 28 receives the sequential designation of the packets from the upper sequencer 22, executes the command sequence for generating the designated packets, and generates the data sequences included in the packets.

Each packet includes a start code and an end code, for example. Each packet may further include a command that identifies the type of the packet. These start codes, end codes, and commands are common data shared by all the types of packets. Accordingly, the lower sequencer 28 generates such common data by reading the data from the address designated by the upper sequencer 22 in the common data storing section 40 storing the common data.

Each packet includes actual data such as an address designating a storage position in the device under test 200, write data that is written to the device under test 200, and read data that is read from the device under test 200. Such actual data is individual data unique to each packet. Accordingly, the lower sequencer 28 generates such individual data by reading the data from the address designated by the upper sequencer 22 in the individual data storing section 44 storing the individual data.

Each packet includes a check code or the like for detecting an error in the data included in the packet. Such a check code is calculated by applying an operation to the data included in the packet. Accordingly, the lower sequencer 28 uses the arithmetic unit 56 in the data processing section 32 to generate the check code or the like. Each packet may include data that is converted according to a prescribed rule, such as an 8b-10b conversion. In this case, the lower sequencer 28 uses the converting section 58 to convert the generated data and then outputs the converted data.

FIG. 9 shows an exemplary test program indicating a packet sequence. The upper sequencer 22 may execute a test program including a plurality of commands executed in sequence, a parameter and packet type corresponding to each command, and an address indicating a storage position of a data sequence and a command sequence for generating the corresponding packet type.

This test program may include an NOP command, an IDXI command, an EXIT command, and the like. The NOP command generates the packet associated with the NOP command once, and the next command is then executed. The IDXI command repeatedly generates the packet associated with the IDXI command a designated number of times, and the next command is then executed. The EXIT command generates the packet associated with the EXIT command once, and the execution of the packet sequence is then ended. This test program is not limited to including these commands, and may include other commands such as a branch command that branches the next command to be executed depending on whether a designated condition is fulfilled.

This test program may further include information concerning the packet type for identifying a write packet, a read packet, an idle packet for repeatedly generating a prescribed code, or the like. This test program may include a beginning address at which the command sequence for generating the packet is stored, a beginning address of the common data included in the packet, and a beginning address of the individual data included in the packet.

FIG. 10 shows an example of a command sequence for generating idle packets and a data sequence included in an idle packet. FIG. 11 shows an example of a command sequence for generating an idle packet and a data sequence included in a write packet.

The lower sequencer 28 may execute a command sequence including a plurality of commands executed in sequence, control data corresponding to each command, and information designating a storage location of output data corresponding to each command. This command sequence may identify the storage location of the data as the common data storing section 40, the individual data storing sections 44, the registers 52, or the converting section 58.

In FIGS. 10 and 11, the hexadecimal values 0x0F and 0x01 designate the common data storing section 40 as the data storage location. The value DB1 designates the first individual data storing section 44-1 as the data storage location. The value DB2 designates the second individual data storing section 44-2 as the data storage location. The value REG1 designates the first register 52-1 as the data storage location.

The command sequence includes an NOP command, an IDXI command, a RTN command, and the like. The NOP command outputs the data stored at the address designated by the pointer in the storage location associated with the NOP command one time, and the next command is then executed. The IDXI command repeatedly outputs the data stored at the address designated by the pointer in the storage location associated with the IDXI command a designated of times, and the next command is then executed. The RTN command outputs the data stored at the address designated by the pointer in the storage location associated with the RTN command one time, and the execution then returns to the upper sequencer 22.

The command sequence executed by the lower sequencer 28 desirably does not include a jump forward command, a branch command, and the like. In this way, the lower sequencer 28 can perform fast processing with a simple configuration.

The command sequence includes an operational expression supplied to the arithmetic unit 56 as the control data. In the example of FIG. 11, the command sequence includes an operational expression (REG1=REG1^DB1 or REG1=REG1^DB2) that writes an XOR of the output data and the data in the first register 52-1 back to the first register 52-1. Instead of this expression, the command sequence may include information designating a conversion process performed by the converting section 58 as the control data.

Figure 12:
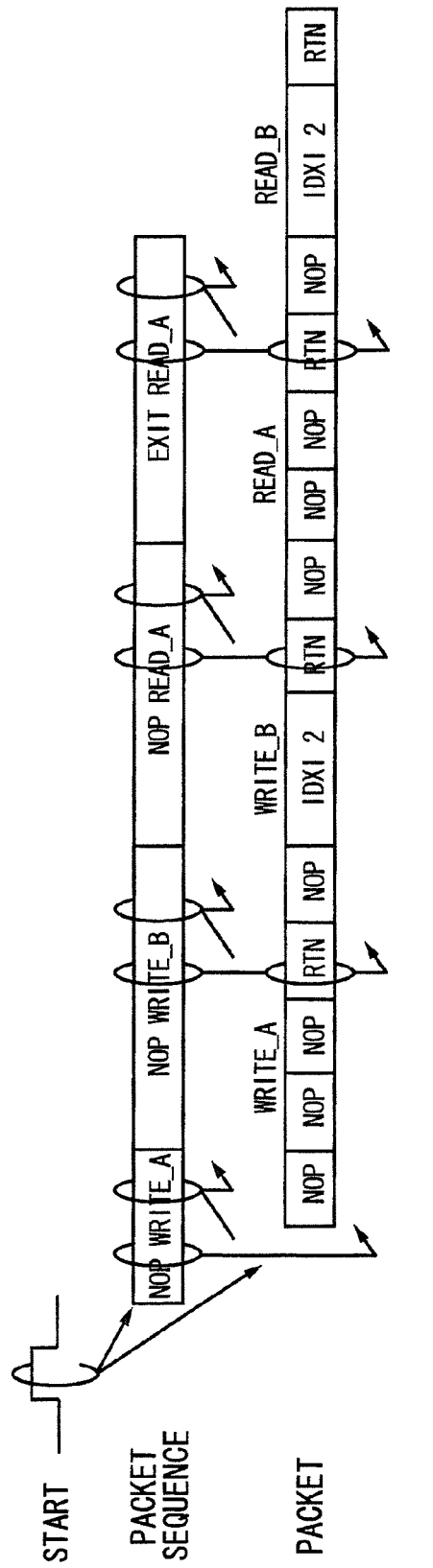
FIG. 12 shows exemplary timings of the processes performed by the upper sequencer 22 and the lower sequencer 28.

FIG. 12 shows exemplary timings of the processes performed by the upper sequencer 22 and the lower sequencer 28. The upper sequencer 22 may start executing the packet sequence upon receiving a start signal from the main control section 18. The upper sequencer 22 designates the packets in the order according to the packet sequence. The lower sequencer 28 executes the command sequence for generating these packets upon receiving the packet designation from the upper sequencer 22.

While the lower sequencer 28 is performing the command sequence of a certain packet, i.e. before the command sequence is completed, the upper sequencer 22 may provide the lower sequencer 28 with the next packet designation. In this way, the lower sequencer 28 can begin executing the command sequence of a certain packet immediately after executing the final command, e.g. the RTN command, of the previous packet. Here, "immediately after" may refer to the subsequent cycle.

Figure 13:
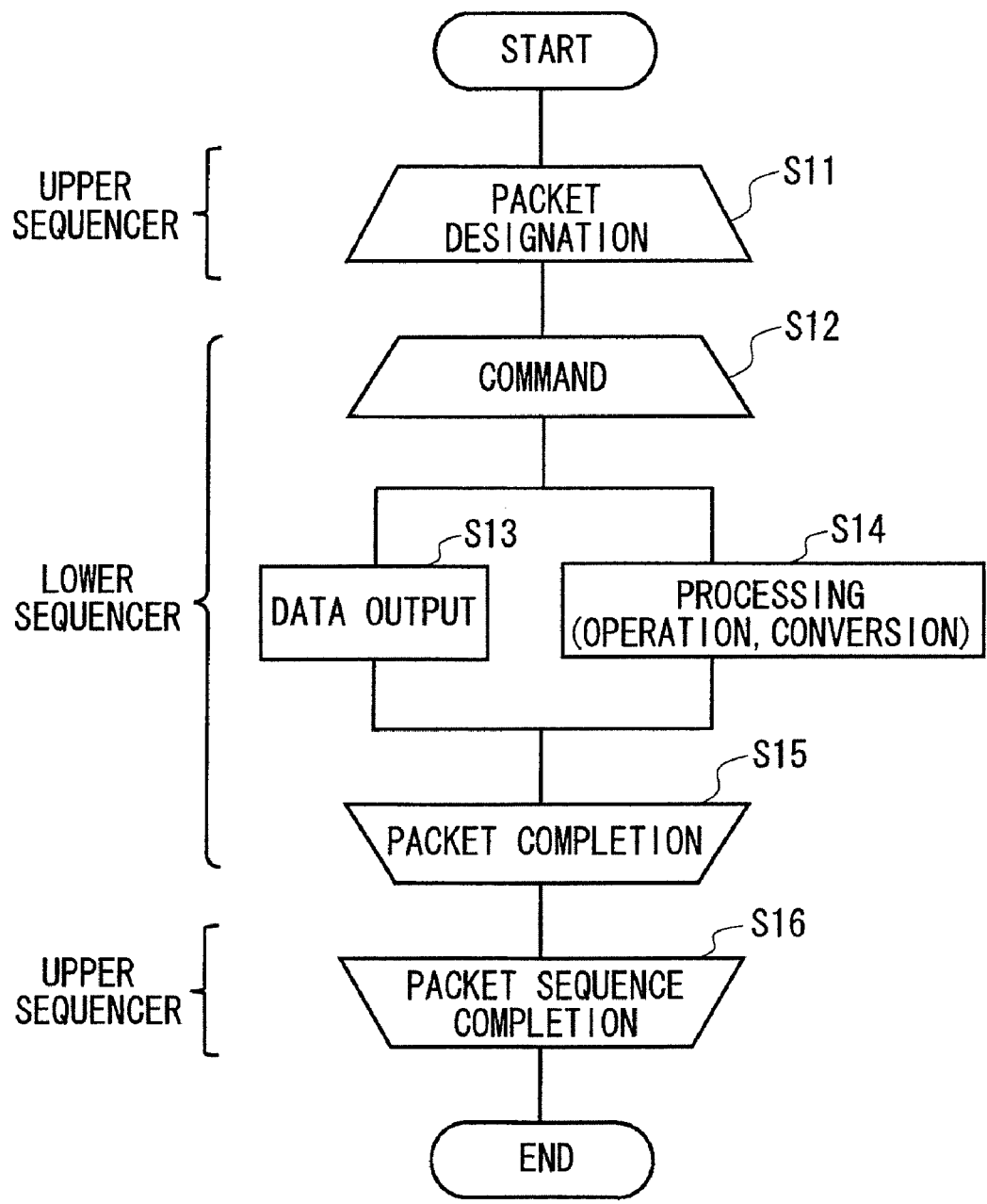
FIG. 13 shows a process flow of the test apparatus 10.

FIG. 13 shows a process flow of the test apparatus 10. First, the upper sequencer 22 executes the test program to sequentially designate the packets sent to and received from the device under test 200 (S11, S16). Upon receiving the packet designation from the upper sequencer 22, the lower sequencer 28 repeatedly executes the processes from step S12 to step S15.

Upon receiving the packet designation, the lower sequencer 28 reads the command sequence for generating the packets from the packet command sequence storing section 24, and performs sequential execution of the commands from the beginning command. When each command is executed, the lower sequencer 28 performs the processes of step S13 and step S14 (S12, S15).

At step S13, the lower sequencer 28 outputs the data corresponding to the current command. At step S14, the lower sequencer 28 performs the operation or data conversion corresponding to the current command. The lower sequencer 28 executes steps S13 and S14 in parallel.

Upon executing the final command, the process flow returns to the upper sequencer 22, which sends the next packet designation to the lower sequencer 28 (S15). Upon completing processing of the final packet in the packet sequence, the upper sequencer 22 ends the process flow (S16).

The test apparatus 10 described in the above embodiment enables the test program indicating the packet sequence and the command sequences in the packets to be executed by separate sequencers. Therefore, using the test apparatus 10 allows the program to be written easily. Furthermore, since the test apparatus 10 can commoditize the data and the command sequences for generating the common packet types, the amount of information stored can be decreased.

The test apparatus 10 according to the above embodiment uses the upper sequencer 22 to individually designate the addresses of the data sequences read by the lower sequencer 28 and the addresses of the command sequences executed by the lower sequencer 28. Therefore, the test apparatus 10 can generate different data sequences from the same command sequence. Accordingly, the test apparatus 10 can decrease the amount of stored information since it is not necessary to store a plurality of the same command sequences.

The test apparatus 10 causes the data processing section 32 to perform the designated process, e.g. an operation or conversion, on the data read from the common data storing section 40 and the individual data storing sections 44. In other words, the data processing section 32 can generate an error detection code and a data conversion to be applied according to a lower layer, e.g. the layer nearest the physical layer, in the packet communication. By generating a data sequence and a command sequence for outputting data in the upper layer in packet transmission and separately designating processes for the lower layer in the packet transmission as described above, the test apparatus 10 allows the program to be easily written and decreases the amount of information stored.

The test apparatus 10 of the present embodiment separates (i) the transmission-side block 12 generating the test data sequence for transmitting signals to the device under test 200 from (ii) the reception-side block 14 generating the test data sequence for comparing the signal received from the device under test 200 with the expected signal, into the upper sequencer 22 and the lower sequencer 28, respectively. The test apparatus 10 allows the respective programs for the reception-side and the transmission-side to be written separately, thereby simplifying the program. The test apparatus 10 can enable communication between the transmission-side lower sequencer 28 and the reception-side lower sequencer 28. In this way, the test apparatus 10 makes it easier to cause the reception-side lower sequencer 28 to begin operating according to a trigger that is an event generated on the transmission-side and to cause the transmission-side lower sequencer 28 to begin operating according to a trigger that is an event generated on the reception-side, for example.

The test apparatus 10 may be provided with a plurality of pairs of transmission-side blocks 12 and reception-side blocks 14. In this case, the main control section 18 provides separate sequences, e.g. separate test programs, to each pair of a transmission-side block 12 and a reception-side block 14, so that each pair can operate independently. In this way, the test apparatus 10 can cause each pair of a transmission-side block 12 and a reception-side block 14 to operate out of synchronization with other pairs.

The main control section 18 may cause each pair of a transmission-side block 12 and a reception-side block 14 to operate in synchronization with the other pairs. In this case, the main control section 18 provides each pair of a transmission-side block 12 and a reception-side block 14 with the same sequence, e.g. the same test program, so that the pairs begin operation in synchronization with each other. In this way, the test apparatus 10 can test in parallel a plurality of devices under test 100 provided with the same type or different types of packet transmission interfaces.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
   an upper sequencer, on a transmission-side relative to the device under test, that sequentially designates packets transmitted to and from the device under test, by executing a test program for testing the device under test;
   a packet data sequence storing section, on a transmission-side relative to the device under test, that stores a data sequence included in each of a plurality of types of packets;
   a lower sequencer, on a transmission-side relative to the device under test, that reads, from the packet data sequence storing section, a data sequence of a packet designated by the upper sequencer and generates a test data sequence used for testing the device under test;
   a transmitting section that transmits the test data sequence generated by the transmission-side lower sequencer to the device under test;
   another upper sequencer, another packet data sequence storing section, and another lower sequencer on a reception-side relative to the device under test; and
   a receiving section that receives a data sequence of a packet from the device under test, wherein
   the reception-side lower sequencer notifies the transmission-side lower sequencer that a data sequence has been received that matches the test data sequence generated by the reception-side lower sequencer, and
   the transmission-side lower sequencer receives the notification from the reception-side lower sequencer and generates a test data sequence of a predesignated packet.

2. The test apparatus according to claim 1, further comprising
   a judging section that judges acceptability of the transmission to and from the device under test based on a result of a comparison between the test data sequence and the data sequence received by the receiving section.

3. The test apparatus according to claim 1, further comprising
   a packet command sequence storing section that stores a command sequence for generating the plurality of types of packets, wherein
   the upper sequencer designates an address of a data sequence in the packet data sequence storing section and an address of a command sequence in the packet command sequence storing section for each packet transmitted to and from the device under test, and
   the lower sequencer reads the data sequence and the command sequence at the addresses designated by the upper sequencer to generate the test data sequence.

4. The test apparatus according to claim 3, wherein
   when a data sequence or a command sequence common to two or more packets in the test program is designated, the upper sequencer designates an address of the same data sequence or an address of the same command sequence for the two or more packets.

5. The test apparatus according to claim 1, wherein
the transmission-side lower sequencer notifies the reception-side lower sequencer that a test data sequence of a predesignated packet has been transmitted to the device under test, and
the reception-side lower sequencer prohibits the judging section from judging acceptability of a data sequence received by the receiving section, until receiving the notification from the transmission-side lower sequencer.

6. The test apparatus according to claim 1, wherein
the packet data sequence storing section includes:
an individual data storing section that stores therein individual data unique to each packet in a data sequence included in each type of packet; and
a common data storing section that stores therein common data that is shared amongst each type of packet, respectively, in a data sequence included in the plurality of types of packets, and
the lower sequencer generates, in a packet designated by the upper sequencer, a data portion to be changed for each packet based on individual data read from the individual data storing section and a data portion common to all packet types based on common data read from the common data storing section.

7. The test apparatus according to claim 6, further comprising
a data processing section that receives data from the common data storing section and the individual data storing section, performs a process designated by the lower sequencer on the received data, and outputs the processed data as the test data sequence.

8. The test apparatus according to claim 7, wherein
the data processing section includes:
a register that stores an operational process result from a previous cycle;
a first selecting section that selects designated data from among individual data from the individual data storing section, common data from the common data storing section, and data from the register;
an arithmetic unit that performs an operation designated by the lower sequencer on the selected data and stores the resulting operational process data in the register; and
a second selecting section that selects data designated by the lower sequencer from among the data selected by the first selecting section and the data stored in the register, and outputs the selected data as the test data sequence.

9. The test apparatus according to claim 8, wherein
the data processing section further includes a converting section that converts the data selected by the first selecting section using a preset table, and
the second selecting section selects data corresponding to a designated packet from among the data selected by the first selecting section, the data in the register, and the data output by the converting section, and stores the selected data as the test data sequence.

10. A method for testing a device under test with a test apparatus, comprising:
providing the test apparatus with an upper sequencer and a lower sequencer on a transmission-side relative to the device under test;
causing the upper sequencer to sequentially designate packets transmitted to and from the device under test, by executing a test program for testing the device under test;
causing the lower sequencer to read, from a packet data sequence storing section storing a data sequence included in each of a plurality of types of packets, a data sequence of a packet designated by the upper sequencer and generate a test data sequence used for testing the device under test;
transmitting the test data sequence generated by the transmission-side lower sequencer to the device under test;
providing the test apparatus with another upper sequencer and another lower sequencer on a reception-side relative to the device under test;
receiving a data sequence of a packet from the device under test;
causing the reception-side lower sequencer to notify the transmission-side lower sequencer that a data sequence has been received that matches the test data sequence generated by the reception-side lower sequencer; and
causing the transmission-side lower sequencer to receive the notification from the reception-side lower sequencer and generate a test data sequence of a predesignated packet.

* * * * *